United States Patent [19]

Nakagawa

[11] 4,156,839
[45] May 29, 1979

[54] SPARK PLUG TESTER

[76] Inventor: Torakichi Nakagawa, 12-26, 1-chome, Tokura, Kokubunji-shi, Tokyo, Japan

[21] Appl. No.: 885,453

[22] Filed: Mar. 10, 1978

[30] Foreign Application Priority Data

Nov. 14, 1977 [JP] Japan ............................... 52-135759

[51] Int. Cl.² ..................... G01M 19/02; G01R 31/00
[52] U.S. Cl. .......................................................... 324/15
[58] Field of Search ..................................... 324/15, 16

[56] References Cited

U.S. PATENT DOCUMENTS 2,926,301  2/1960  Westberg et al. ................ 243/16 R

FOREIGN PATENT DOCUMENTS 798992  11/1968  Canada ................................. 324/16 R
1145139  3/1969  United Kingdom ................ 324/16 R Primary Examiner—Stanley T. Krawczewicz

[57] ABSTRACT

A novel spark plug tester for testing the sparking voltage of a spark plug in an internal combustion engine for an automobile and other vehicles which is actuated with generation of proper pulsatile sparking voltage, said tester having an electrical circuit capable of checking the actuation of the plug to prevent erroneous indication.

5 Claims, 4 Drawing Figures

SPARK PLUG TESTER

FIELD OF THE INVENTION

The present invention relates to the improvement in a spark plug tester for indicating whether or not sparking voltage reaches a proper level in a spark plug of an internal combustion engine of vehicles such as an automobile.

BACKGROUND OF THE INVENTION

Generally, a spark plug tester has an electrical circuit which includes a high voltage capacitor connected with an output of a D-C high voltage generator through a high resistance, and said capacitor is further connected in parallel with a spark plug to be tested. Specifically, in such a circuit, the capacitor is charged through the high resistance so that the terminal voltage of the capacitor is gradually raised. When the terminal voltage reaches a sparking level, the spark plug fires upon electrical discharge of the capacitor whose potential is instaneously dropped to the low level, seasing the discharge. The terminal voltage of the capacitor thereafter sets out gradual rising by charging, and when it gets to the sparking level, an instantaneous discharge is generated by sparking. As the circuit of the tester repeats the foregoing sequence, terminal voltage of the capacitor varies in the form of saw-tooth pulsatile wave, which is a phenomenon called relaxation oscillation. In such an electrical variation, the voltage level at the time of completion of discharge by sparking, namely the lowest voltage level, is much smaller than the sparking voltage level of the upmost potential in the above-mentioned pulsatile wave, and becomes a substantially constant value irrespective of the sparking voltage level. In respect of such varying voltage characteristic, the testing for whether sparking voltage level of the plug is proper or not, may be performed by observing an average value of pulsatile voltage with a D-C indicator.

However, a spark plug tester utilizing the preceding principle has a fatal defect in misleading a wrong plug as good one. In case a current flow leaks in a tested plug due to adherence of soot and dust particles thereto or due to a high humidity, the maximum voltage in the capacitor is equivalent to a value determined by dividing output potential of the D-C high voltage generator into two portions through the aforesaid high resistance and leakage resistance of plug. If the capacitor voltage does not reach the sparking level of tested plug, relaxation oscillation is not generated and therefore testing fails to observe an average value of varying voltage. However, even in this case, the D-C indicator represents the divided voltage level of the capacitor, and if the divided level is equal to the proper average value of pulsatile voltage obtained in testing of a good plug, the wrong plug is mistaken as good one.

SUMMARY OF THE INVENTION

Accordingly, the first object of the present invention is to provide a new spark plug tester capable of preventing the above-mentioned erroneous observation resulted from the leakage resistance in a spark plug. In order to attain the first object of the invention, the erroneous observation is prevented by checking generation of the relaxation oscillation. In detail, only when relaxation oscillation is produced, an alternating current flows through the high voltage resistant capacitor. In considering this alternating current, the spark plug tester according to the invention includes an impedance element such as high capacitor connected in series with the high voltage resistant capacitor of the tester so that the alternating current flowing through the high voltage resistant capacitor is rectified and applied to a display device.

Nevertheless, it has been found that there is an undesirable case where the spark plug tester having such an impedance element does not exactly perform its function. If a leakage current flows through the high voltage resistant capacitor or wirings connected therewith because of abnormal increase of atmospheric humidity or other some cause, the current goes into the rectifying circuit connected with the low impedance element. For the reason, even when a tested spark plug is not connected with the tester, in other words even when relaxation oscillation is not generated, the display device is operated so as to cause an errorneous observation.

Accordingly, the second object of the instant invention is to provide another new spark plug tester capable of preventing the foregoing erroneous observation resulted from a leakage current in the high voltage resistant capacitor which constitutes a part of the relaxation oscillation circuit in cooperation with a plug to be tested. In order to attain the second object of the invention, another high capacitance is located in series between the high voltage resistant capacitor and the low impedance element, and simultaneously a by-pass resistance is provided in parallel with a series circuit composed of the high capacitance and low impedance elements to make the leakage current of the capacitor flow to said by-pass. Alternatively, the spark plug tester of the invention may comprise a parallel circuit composed of another high capacitance and resistances, and this parallel circuit is connected with the rectifying circuit via a capacitor for arresting the D-C component.

These and other objects and advantages of the present invention will be apparent from the following detailed explanation, in connection of the accompanying drawings.

DESCRIPTION OF DRAWINGS

Referring now to the drawings.

DETAILED DESCRIPTION OF PREFERRED EMBODIMENTS

Figure 1:
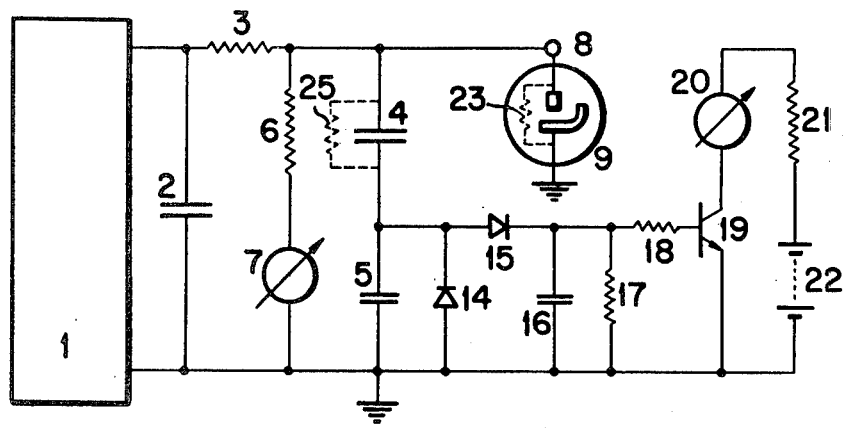
FIG. 1 shows an electrical circuit used in the spark plug tester according to the present invention.

As seen in FIG. 1 of the drawings, a spark plug tester of the invention includes a D-C high voltage generator 1 for example of the order of 10 Kilovolt (KV), a smoothing capacitor 2 connected paralleled with said high voltage generator, and a series circuit comprising a high resistance 3 of more than few megohm, a high voltage resistance capacitor 4 of hundreds picofarad and a high capacitor 5 having a capacity hundreds times that of capacitor 4, one side of high capacitance 5 being connected with ground. Between capacitors 2 and 4, a series circuit is provided having a high resistance 6 of several tens megohm and a D-C ammeter 7 of the moving coil type, and a high voltage terminal 8 of capacitor 4 is connected with one electrode of a spark plug to be tested, the other electrode of which is led to ground.

Figure 2:
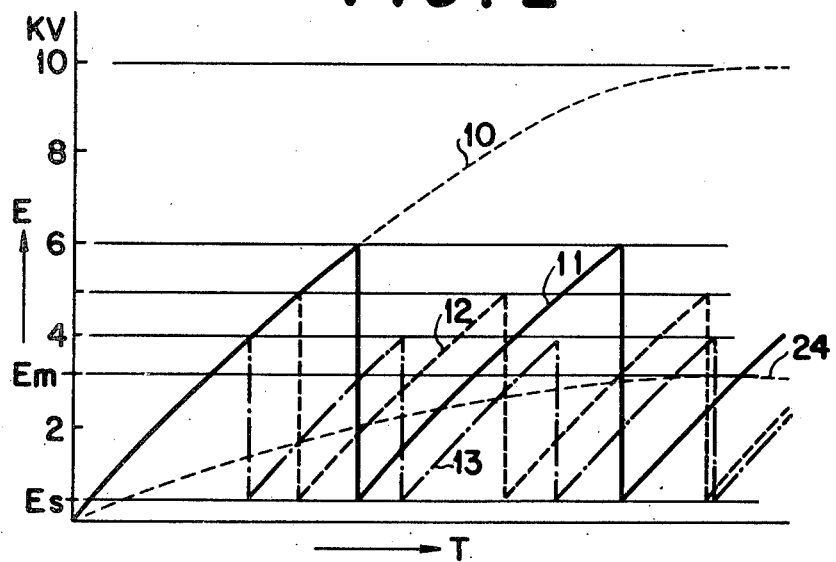
FIG. 2 is a diagram illustrating the operation of the circuit shown in FIG. 1.

FIG. 2 shows a diagram illustrating the operation of the circuit in FIG. 1, which shows varying voltages of the capacitors used in the spark plug tester wherein horizontal and vertical axes indicate time T and voltage level E of terminal 8 respectively. Since capacitor 5 has a capacity much larger than that of capacitor 4, total or combined capacity of the series circuit including these capacitors nearly amount to that of capacitor 4. Assuming that the combined capacity is C and value of the high resistance 3 is R, capacitors 4 and 5 are charged at time constant CR from high voltage generator 1. Then, if terminal 8 is not connected with an electrode of a spark plug to be tested, voltage level of terminal 8 is elevated at a slow rate as shown by a dotted line 10 in FIG. 2 and mounts up to output voltage of 10 kilovolts (KV) of generator 1. However, in case terminal 8 is connected with a plug 9 for example having 6 KV sparking voltage, a sparking discharge is generated when the voltage level of terminal 8 reaches 6 KV. Since equivalent resistance of the spark discharge is extremely small, or even negative as the case may be, voltage of terminal 8 is lowered at the moment of discharge of capacitors 4 and 5. When the voltage is lowered below the discharge maintaining level $E_s$, firing of plug is stopped. From this time, the voltage level of terminal 8 again begins to rise at the slow rate with charge of capacitors 4 and 5, and when it reaches 6 KV, plug 9 gives rise to spark discharge. Consequently, the voltage of terminal 8 varies in the form of saw tooth wave as indicated by full-line 11 in FIG. 2. In other words, relaxation oscillation voltage is generated at terminal 8 whose maximum level corresponds to the spark generating voltage in plug 9 and the minimum level thereof corresponds to discharge maintaining voltage $E_s$. The voltage $E_s$ is substantially constant irrespective of sparking voltage, and has a low value below hundreds volts. Assuming that the sparking voltage of plug 9 connected with terminal 8 is 5 or 4 KV, each wave of varying relaxation oscillation voltage at the terminal may be indicated by a dotted line 12 or a dot-and-dash line 13 in FIG. 2. Each average value of these varying pulsatile voltages obviously corresponds to the upmost level, namely sparking voltage. Accordingly, such a sparking voltage can be observed by measuring the average value of pulsatile voltage with use of a D-C ammeter 7 which is connected with terminal 8 through the high resistance 6. Incidentally, since the sparking voltage is nearly proportional to gap distance of the spark plug, wearing degree of plug electrodes may be determined by observing the sparking voltage.

As seen in FIG. 1, the spark plug tester of the present invention is provided with a diode 14 and a series circuit, both of which being connected with a junction between capacitors 4 and 5, said series circuit including a diode 15 and a capacitor 16 which is further connected in parallel with a resistor 17.

The spark plug tester also comprises a transistor 19, the base of which is connected with a junction between capacitors 4 and 5 via diode 15 and a resistor 18. The base and emitter of transistor 19 are connected through resistor 18. The collector of transistor 19 is connected to a D-C electrical source 22 of for example 12 volts, through a resistor 21 and display device 20. As is self-explanatory to skilled in the art, these diodes 14, 15, capacitor 16 and resistor 17 constitute a peak-to-peak rectifying circuit for alternating current appearing on capacitor 5. Consequently, when pulsatile voltage is applied across capacitor 5, a voltage corresponding to the amplitude of the pulsation, appears on resistor 17, and transistor 19 is turned on. Under the circumstances, an essentially constant current determined by resistor 21 flows through the display device or a meter 20, and deflection of pointer of the meter indicate the application of that pulsatile voltage across capacitor 5.

When a sparking discharge is generated in plug 9 mounted in the tester schematically shown in FIG. 1 and thereby a pulsatile voltage occurs at terminal 8 as indicated by various lines 11, 12 or 13 shown in FIG. 2, the voltage is divided into two paths through capacitors 4 and 5 in inverse proportional relationship to their capacities. Therefore, capacitor 5 is supplied with a pulsatile voltage of about 10 volts, approximately hundredth of voltage at terminal 8. Since the peak-to-peak rectifying circuit rectifies the pulsating component of the divided voltage, D-C voltage of more than few volts corresponding to the amplitude of the pulsating component appears at resistor 17, and then transistor 19 is turned on giving the deflection of pointer in the display device 20.

Assuming that there is a leakage resistance 23 in plug 9 as shown by dotted line in FIG. 1, for example due to adherence of soot and dust particles to the plug electrode, the maximum voltage applied to terminal 8 is of a level determined by divided output voltage of generator by resistor 3 and the leakage resistance 23. When such a wrong plug giving the current leakage is connected with terminal 8 and a switch of the circuit is actuated, the voltage at terminal 8 is elevated as shown by the dotted line 23 in FIG. 2 and reaches the maximum level Em. In case the maximum level is lower than the sparking voltage of the plug, no discharge is occurred, and testing is impossible. On the other hand, since the smoothed D-C voltage Em continues to be applied to terminal 8, ammeter 7 indicates the deflection corresponding to the voltage Em. If this deflection is equivalent to average value of pulsatile voltage obained in a good plug as shown by the dotted line 12 in FIG. 2, a wrong plug might be mistaken as good one. In this case, the pulsatile voltage of saw-tooth wave is not generated at terminal 8; in other words, only D-C voltage is applied to capacitor 5 in the charging process, and an electric charge on capacitor 5 is discharged through diode 15 and resistor 17 and is entirely extinguished after a short period of time. This means that the voltage Em is applied only across capacitor 4, and an electric charge on capacitor 5 remains extinguished. Consequently, in this case, since no D-C voltage is supplied to the peak-to-peak rectifying circuit, transistor 19 is maintained in off position, giving no deflection in display device 20.

As above-mentioned, display device 20 represents the deflection only when the sparking discharge is produced in plug 9. Accordingly, to prevent an erroneous observation on ammeter 7, the deflection of pointer thereof may be checked after confirmation of the actuation of display device 20. Instead of the display device, a luminous diode may be used, and in such a case, ammeter 7 is measured after confirmation of luminescence of the diode.

Figure 3:
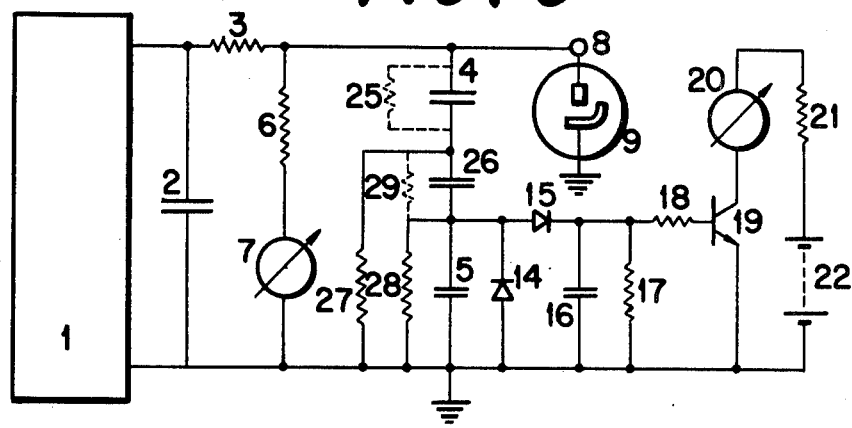
FIGS. 3 and 4 show other embodiments of electrical circuits according to the present invention.

FIG. 3 is an alternative electric circuit of the apparatus which prevents an erroneous observation when there is a leakage current in the high voltage resistant capacitor 4. Specifically, when a leakage resistance 25 as indicated by dotted line in FIG. 1 exists in capacitor 4, a direct current flows through leakage resistance 25, diode 15 and resistor 17. When terminal 8 has not been connected with a tested plug 9, or when the plug is a wrong one which can not generate sparking discharge, D-C voltage of 10 KV is applied to terminal 8. Even though the leakage resistance is assumed as 1000 megohm and resistance of resistor 17 is 1 megohm, the direct current flowing through leakage resistance 25, diode 15 and resistor 17 is about 10 microampere, and a 10 volt voltage is applied to resistor 17 thereby actuating transistor 19. This provides a cause of an erroneous observation because the actuation of transistor 19 gives rise to pointer deflection in display device 20 without generation of relaxation oscillation. The electric circuit shown in FIG. 3 is capable of avoiding the aforesaid defect, wherein a high capacitor 26 is located in series between the high voltage resistant capacitor 4 and high capacitance 5 and simultaneously resistors 27 and 28 are connected in parallel to the series circuit containing capacitors 26 and 5.

In FIG. 3, assuming that both of resistors 27 and 28 are, for example of 100 kilo-ohm and leakage resistance 29 of capacitor 26 is 1000 megohm, a leakage current of capacitor 4 of about 10 microampere as aforesaid, flows for the most part through resistor 27 so that a leakage current flowing into capacitor 26 is only approximately $10^{-3}$ microampere. As this leakage current is further divided into two flow paths through resistors 28 and 17, when resistance of resistor 17 is 1 microohm, only about $10^{-4}$ microampere current flows through resistor 17, and therefore there is not generated a sufficient voltage in resistor 17 to actuate transistor 19.

When the capacity of capacitor 4 is selected, for example, as 400 picofarad and for both of capacitors 26 and 5 as approximately 0.4 microfarad, both time constants of two circuits, one comprising capacitors 26, 5 and resistor 27 and the other comprising capacitor 5 and resistance 28 are more than several times that of the relaxation oscillation circuit including capacitor 4 and the resistor 3. Therefore, when a relaxation oscillation is generated at terminal 8, a voltage having substantially the same wave form as that of the relaxation oscillation is produced across capacitor 5, without giving any essential effect upon observation of sparking voltage of the plug.

Figure 4:
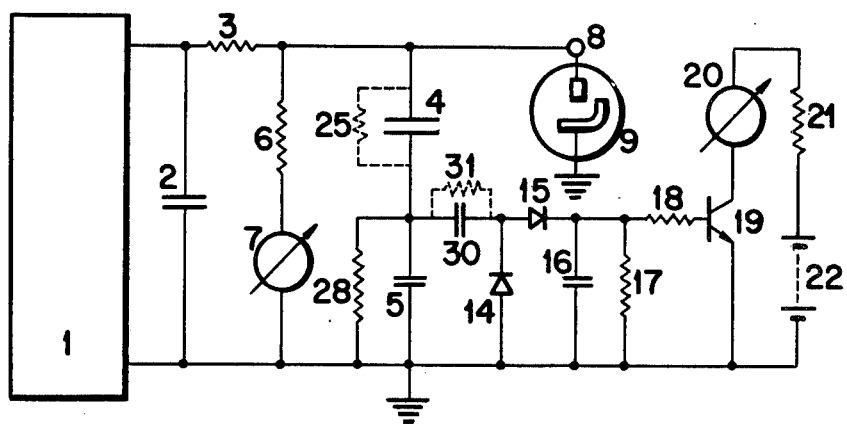

FIG. 4 indicates further another embodiment of the electric circuit capable of preventing erroneous observations which might be caused by leakage resistance 25 in capacitor 4, wherein only resistor 28 is connected in parallel with capacitor 5 and a capacitor 30 is interposed between capacitor 5 and the peak-to-peak rectifying circuit comprising diodes 14, 15, capacitor 16 and resistor 17. In the event a leakage resistance 31 is produced in capacitor 30 in this circuit as shown by dotted line in FIG. 4, a leakage current of capacitor 4 flows through two paths, one including resistor 28 and the other including leakage resistance 31, diode 15 and resistor 17. Therefore, assuming that leakage resistance 31 is 1000 megohm and resistance of resistor 28 is 100 kilo-ohm, and further the leakage current in capacitor 4 is 10 microampere, as in the previous example, the current flowing through resistor 17 would be only $10^{-3}$ microampere so that no voltage is generated sufficient to actuate transistor 19.

What is claimed is:

1. A spark plug tester comprising;
    a D-C high voltage generator;
    a series circuit including a high voltage resistant capacitor and a low impedance element connected with low voltage side of said capacitor, said circuit being connected at its one end to the output of the D-C high voltage generator through a resistor, and connected in parallel to a spark plug to be tested;
    an indicator showing a pulsatile voltage of relaxation oscillation generated across said series circuit;
    a rectifying circuit connected across said low impedance element; and
    a display device connected to the output of said rectifying circuit.

2. A spark plug tester as set forth in claim 1 wherein said low impedance element is a high capacitor.

3. A spark plug tester as set forth in claim 1 further comprising;
    a high capacitor located in series between the high voltage resistant capacitor and the low impedance element in the series circuit, said low impedance element being connected to the low voltage side of the high voltage resistant capacitor; and
    a by-pass resistor connected in parallel to the series circuit including the high voltage resistant capacitor and low impedance element.

4. A spark plug tester as set forth in claim 2 further comprising;
    another high capacitor located in series between the high voltage resistant capacitor and the high capacitor connected to the low voltage side of said high voltage resistant capacitor in the series circuit; and
    two resistors, one being connected in parallel to the series circuit comprising above-mentioned two high capacitors, and the other being in parallel to said high capacitor connected to the low voltage side of said another high capacitor.

5. A spark plug tester as set forth in claim 2 further comprising;
    a resistor connected in parallel to the high capacitor; and
    another capacitor connecting the rectifying circuit across said high capacitor.

* * * * *